United States Patent [19]
Little et al.

[11] Patent Number: 5,032,896
[45] Date of Patent: Jul. 16, 1991

[54] 3-D INTEGRATED CIRCUIT ASSEMBLY EMPLOYING DISCRETE CHIPS

[75] Inventors: Michael J. Little, Woodland Hills; Jan Grinberg, Los Angeles; Hugh L. Garvin, Malibu, all of Calif.

[73] Assignee: Hughes Aircraft Company, Los Angeles, Calif.

[21] Appl. No.: 401,371

[22] Filed: Aug. 31, 1989

[51] Int. Cl.$^5$ ............... H01L 23/16; H01L 39/02; H01L 25/48; H01L 29/46
[52] U.S. Cl. .............................. 357/75; 357/71; 357/80; 361/420; 361/416; 361/413
[58] Field of Search ................... 357/71, 75, 80; 361/393, 412, 413, 416, 420

[56] References Cited

U.S. PATENT DOCUMENTS

| | | | |
|---|---|---|---|
| 3,757,175 | 9/1973 | Kim et al. | 357/75 |
| 4,221,067 | 9/1980 | Marken et al. | 29/840 |
| 4,239,312 | 12/1980 | Myer | 339/17 N |
| 4,275,410 | 6/1981 | Grinberg et al. | 357/68 |
| 4,507,726 | 3/1985 | Grinberg et al. | 364/200 |
| 4,541,035 | 9/1985 | Carlson et al. | 361/414 |
| 4,707,859 | 11/1987 | Nudd et al. | 382/28 |
| 4,783,695 | 11/1988 | Eichelberger et al. | 357/65 |
| 4,901,136 | 2/1990 | Neugebauer et al. | 357/75 |

FOREIGN PATENT DOCUMENTS 3233195  3/1983  Fed. Rep. of Germany ........ 357/75

OTHER PUBLICATIONS

R. O. Carlson et al, "A High Density Copper/Polyimide Overlay Interconnection", Eighth International Electronics Packaging Conference, Nov. 7-10, 1988.
"GE Method overcomes previous wafer-scale integration problems", E. J. Lerner, Research & Development Magazine, 10/85, pp. 51-52.
"High Density Overlay for Bare Chip Interconnect", J. E. Kohl, 1988 GOMAC Proceedings, pp. 445-448.

Primary Examiner—Rolf Hille
Assistant Examiner—David Ostrowski
Attorney, Agent, or Firm—V. D. Duraiswamy; W. K. Denson-Low

[57] ABSTRACT

A 3-D IC chip assembly is formed from stacked substrates in which each individual substrate has a plurality of different IC chips retained in respective recesses. Conductive feedthroughs extend through the substrate from the side where the chips are located to the opposite side, with the chips electrically connected to the feedthroughs. An electrical routing network on the opposite side of the substrate from the chips provides desired interconnections between the chips by connecting to the feedthroughs. The routing can be formed by standard photolithographic techniques.

12 Claims, 6 Drawing Sheets

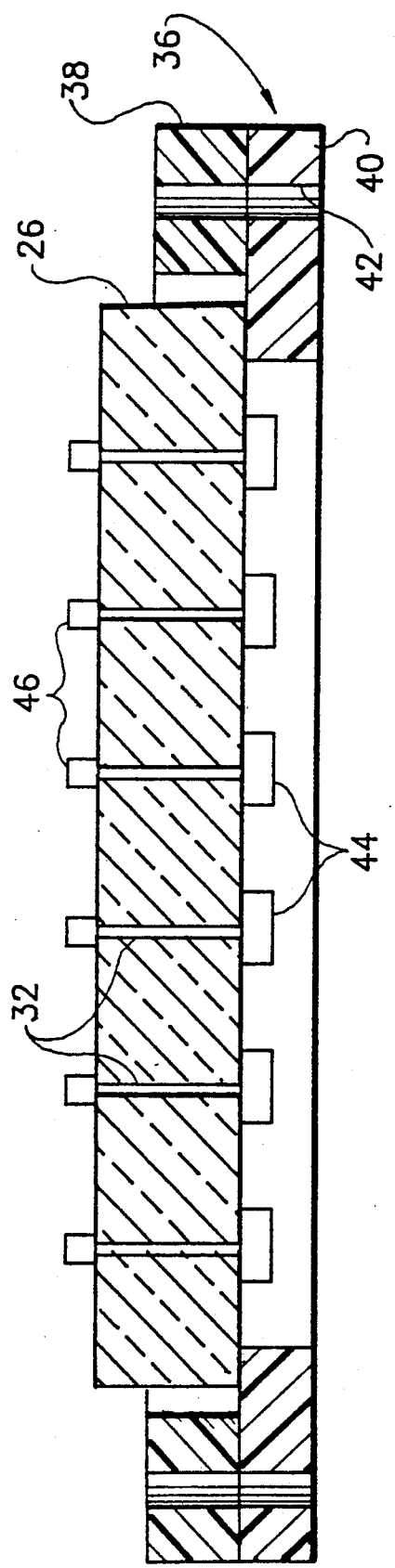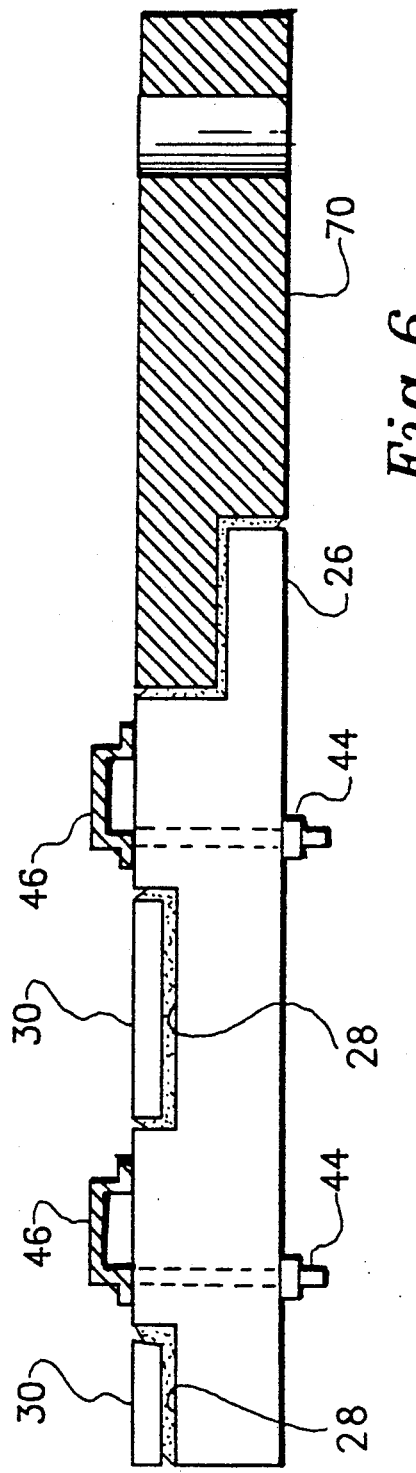
Fig. 3.
Fig. 6.

3-D INTEGRATED CIRCUIT ASSEMBLY EMPLOYING DISCRETE CHIPS

BACKGROUND OF THE INVENTION

1. Field of the Invention

This invention relates to high density integrated circuit (IC) structures, and more particularly to a multilayer 3-D assembly employing a collection of discrete IC chips.

2. Description of the Related Art

There is a continuing need for microelectronic systems employing high density circuits with many data lines. Such systems are conventionally constructed with prefabricated IC circuits sealed in packages, mounted on printed circuit boards and provided with interconnections between the circuit packages by means of connectors, backplanes and wiring harnesses. To reduce the size, weight and power consumption of such systems, multiple chips can be sealed inside a single package. This multiple packaging approach raises the level of integration at the lowest packaging level, and improves the system size, weight and power characteristics.

A much higher level of integration at this lowest packaging level has been achieved with a new 3-D microelectronics technology which reorganizes the physical structure and approach to parallel computing. The 3-D computer employs a large number of parallel processors, typically $10^4$–$10^6$, in a cellular array configuration. A wide variety of computationally intensive applications can be performed by this processor with substantial system level advantages. To handle the very large number of data lines (typically $10^4$–$10^6$), a stacked wafer approach is taken, with electrical signals passing through each wafer by means of specially processed feedthroughs. The wafers are interconnected by means of micro-bridges.

The 3-D computer is described in U.S. Pat. No. 4,507,726 to Grinberg et al. and U.S. Pat. No. 4,707,859 to Nudd et al., both assigned to Hughes Aircraft Company, the assignee of the present invention. As shown in FIG. 1, a plurality of elemental array processors are provided which are composed of a vertical stack of modules. The modules are arranged as functional planes, 2, 4 and 6. Modules of a similar functional type are located on each plane. For example, comparator modules 8 might be located on plane 12, and memory modules 10 on plane 4. Plane 6 typically contains modules 12 that are used to perform particular image processing functions. Additional planes may be added below the plane 6 as needed to complete the processing functions.

Each elemental processor is composed of a vertical stack of modules 8, 10 and 12. Each processor is designed to perform operations on a single data element. Signals are transferred between modules in each processor using data buses. For example, signals may be passed between a module 8 and a corresponding module 10 using a data bus 14. Similarly, signals are passed between a module 10 and a corresponding module 12 using a data bus 16.

The overall processor is intended to be employed for two-dimensional image analysis. To process an image, the image is converted into suitable binary form for use by the elemental processors by an array 18 of photosensors 20. The photosensors 20 are arranged in a matrix such that there is one photosensor 20 for each of the elemental processors. The number of photosensors 20 (and hence the number of processes) corresponds to the number of picture elements (pixels) into which an image 22 to be analyzed is to be divided. Each photosensor 20 provides a sensor output signal on a data bus 24 to a corresponding comparator module 8, where it appears as a comparator input signal. The magnitude of the sensor output signal is proportional to the brightness of the corresponding pixel of the image 22.

The various planes 2, 4, 6 are implemented as separate wafers, each wafer having a unitary IC distributed over its upper surface with monolithically integrated interconnections between circuit elements. Interconnections between adjacent wafers in the stack are formed by electrically conductive feedthroughs which extend through the wafers from the IC on the upper surface to the lower surface, and a collection of spring contacts on both the upper and lower sides of the wafers. The spring contacts on the upper sides of the wafers make electrical contact with selected locations on the IC, while the spring contacts on the bottom electrically connect to selected feedthroughs. The spring contacts are positioned so that the ones on top of a wafer bear against and electrically connect to corresponding spring contacts on the bottom of the next wafer above. The feedthroughs can be formed by a thermal migration of aluminum, while the spring contacts are implemented as micro-bridges. Both techniques are described in U.S. Pat. Nos. 4,239,312 and 4,275,410, assigned to Hughes Aircraft Company.

While the processor described above provides a very high density of circuitry, it is limited in the sense that a custom designed IC is fabricated on each wafer, and that wafer can serve no other purpose. Furthermore, each wafer is generally limited to a single class of circuitry CMOS, bipolar, $I^2L$, etc.). A different approach to high density circuit packaging which provides a greater degree of freedom in the flexibility of circuit design is disclosed in a paper by R. O. Carlson et al., "A High Density Copper/Polyimide Overlay Interconnection", Eighth International Electronics Packaging Conference, Nov. 7-10, 1988. With this approach, discrete pre-fabricated "off-the-shelf" IC chips can be integrated and interconnected into a single layer. Changes in circuit design can be accommodated by merely changing the discrete chips, with an accompanying change in the interconnections as necessary. The separate chips are set in openings cut through an alumina or silicon frame, and bonded in place with a thermoplastic resin such as duPont "Pyralin". The frame thickness is chosen to be a little less than most silicon chips, typically 20 mils. The frame is bonded to an alumina or silicon substrate, about 50 mils thick, which provides heat dissipation. The chips can be placed very close together; 5–10 mils are said to be typical chip spacings and spacings to the recess walls.

A polyimide sheet is then laminated over the frame. A computer-controlled laser beam is next used to open vias through the polyimide sheet down to selected locations on the chips. Interconnect metallization between the chips is formed by sputtering over the entire surface a thin adhesive metal followed by a thin copper sputtering, a thick copper plating, and a final adhesive metal sputtering. The metals are patterned into the interconnecting network by exposing a negative resist with the computer controlled laser beam, and removing undesired metal with etches. The metallization extends down through the vias to contact the selected locations on the chips. Successive signal layers are built up by spraying or spinning on a polyimide dielectric, opening vias with the laser to the underlying metal layer, and depositing metals and patterning with a photo-resist/etching process.

While the described approach provides a high packing density of bare chips, it is limited to a two-dimensional array and is not applicable to a three-dimensional stack. The use of a conductive heat dissipating substrate in fact prevents the use of the underside of the device for carrying electrically separated interconnects to another level below. The construction of the assembly also makes it difficult to efficiently test either the interconnect metallization (the "routing") or individual chips. If the routing is tested and found to be defective, the assembly will either be discarded or the routing repaired. If the assembly is discarded, the chips that have already been put in place prior to formation of the routing will be lost. If the routing is repaired by stripping it away and doing it over again, there is a risk of damaging the underlying chips. If, on the other hand, the routing is found to be correct but a chip found to be defective once the assembly has been completed, it is necessary to strip off the overlying routing to access and replace the defective chip, and then reform the entire routing network.

SUMMARY OF THE INVENTION

The present invention provides an IC packaging structure which has the high density two-dimensional packing and discrete chip design flexibility of the Carlson et al. approach, and yet is capable of being used in a three-dimensional stack to provide an even greater circuit density. The invention also resolves the inefficiencies inherent in the correction of defective routing or chips with the Carlson et al. approach.

In accordance with the invention, a plurality of discrete IC chips are retained in recesses which extend into one side of a substrate, while a plurality of conductive feedthroughs extend through the substrate. The IC chips are selectively electrically connected to the feedthroughs along one surface of the substrate, with the feedthroughs providing electrical paths between the selected chip pads and the opposite side of the substrate. Thin-film capacitors may also be located in the recess areas below the IC chips to serve as decoupling capacitors for the high speed circuit chips.

In the preferred embodiment, the interconnect routing is located on the opposite side of the substrate from the IC chips, and establishes the desired chip-to-chip interconnects by interconnecting the chips with the feedthroughs and the feedthroughs with the routing network on the backside. The routing comprises a series of alternating conductive and non-conductive network layers which are photolithographically patterned to establish the intended chip interconnections. The substrate is formed from a material that is generally thermally matched with the IC chips; for silicon chips, the substrate is either silicon or aluminum nitride.

A number of the assembled circuit packages can be provided as multiple layers of a 3-D stack with successive layers preferably interconnected by means of aligned microbridge springs. Locating the routing on the underside of the substrates facilitates this structure.

Further features and advantages of the invention will be apparent to those skilled in the art from the following detailed description of preferred embodiments, taken together with the accompanying drawings, in which:

DESCRIPTION OF THE DRAWINGS

FIG. 3 is a sectional view of a circuit assembly in accordance with the invention, showing feedthroughs and micro-bridges;

FIG. 6 is a sectional view of one circuit package showing the discrete chips, micro-bridge connectors and carrier.

DETAILED DESCRIPTION OF THE INVENTION

Figure 1:
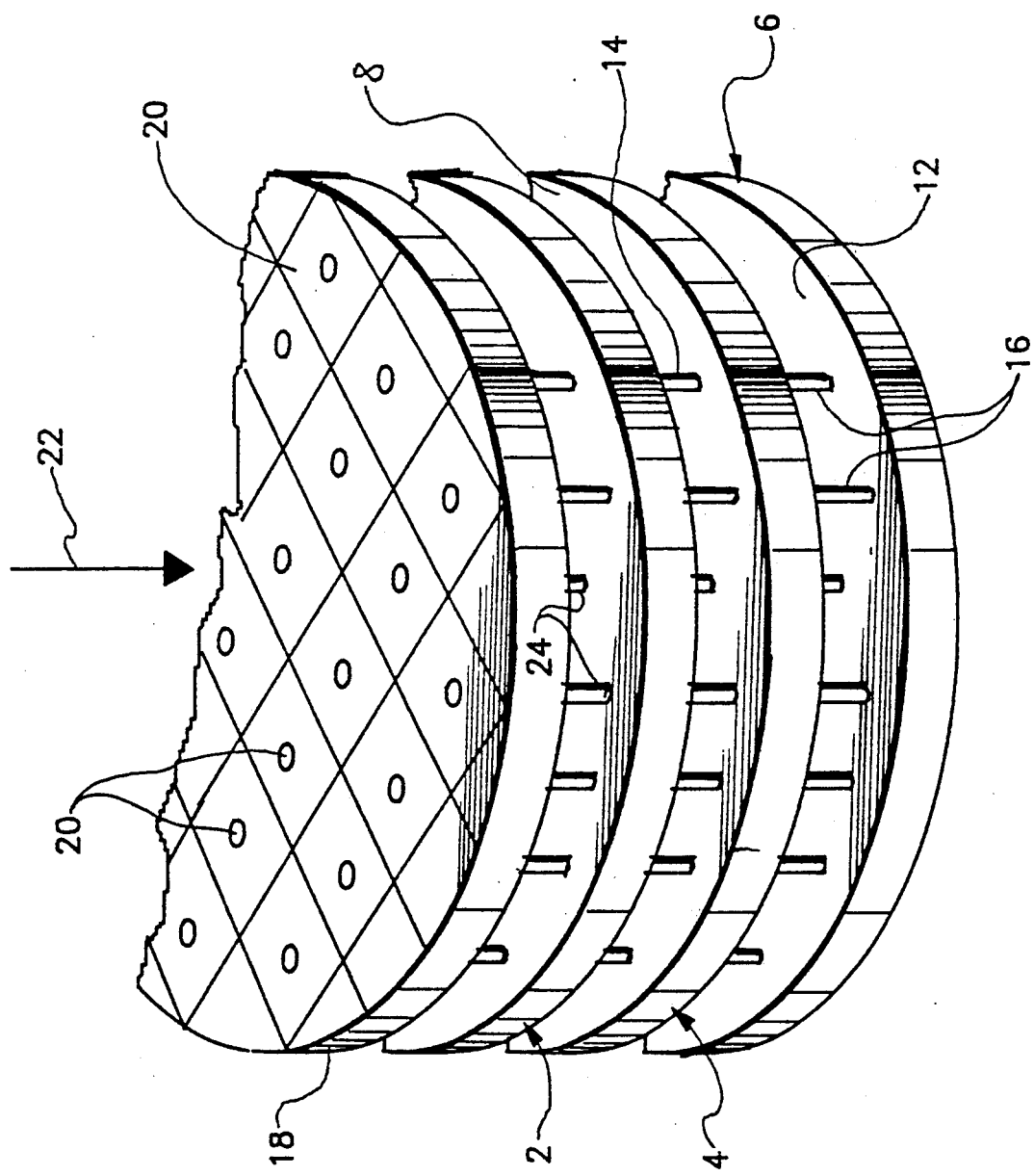
FIG. 1 is a fragmentary perspective view of a prior multi-level matrix of elemental processors implemented in a wafer stack and coupled to a photosensor array, described above.
Figure 2:
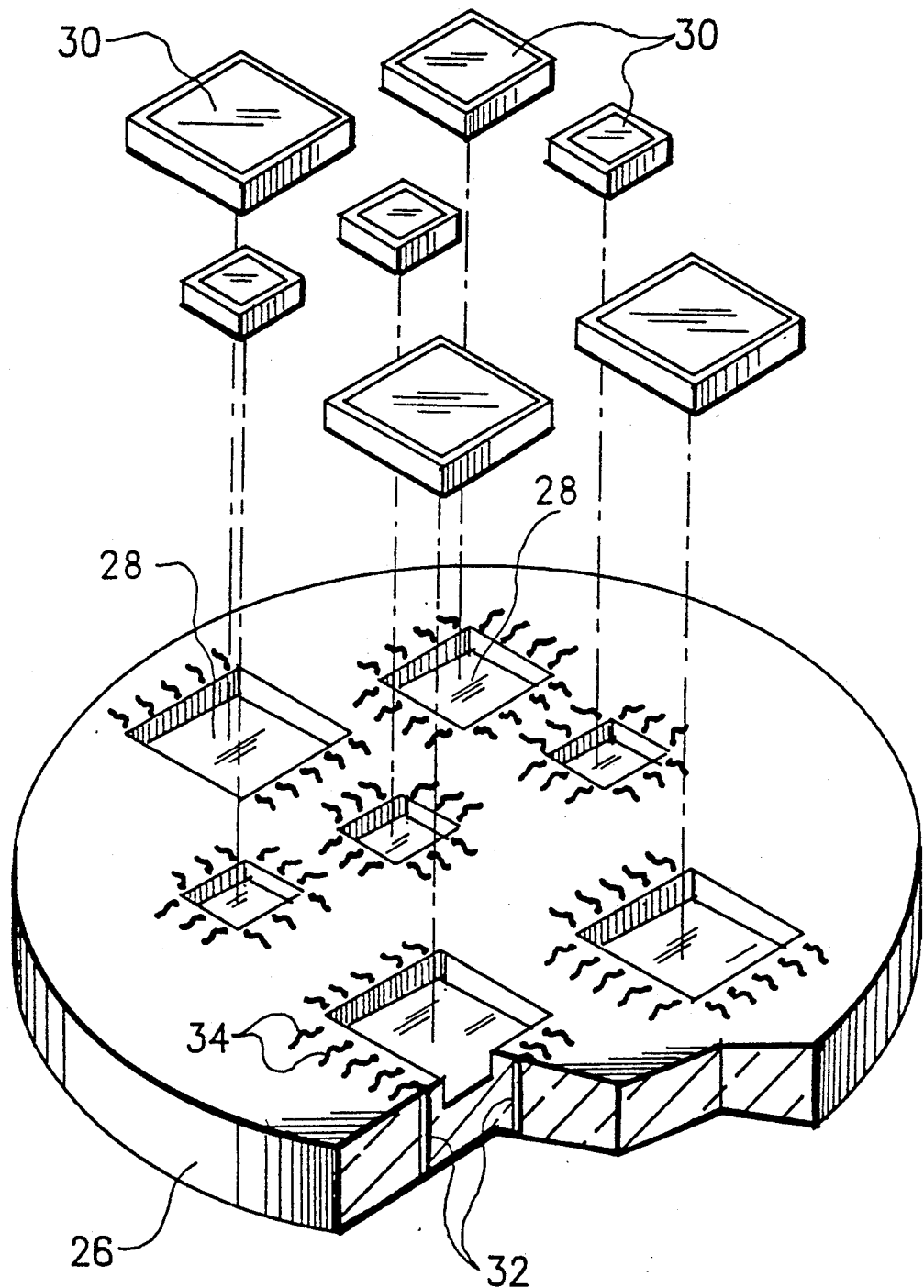
FIG. 2 is an exploded perspective view of a substrate with discrete IC chips lodged therein in accordance with the invention.

FIG. 2 illustrates the manner in which a high density microelectronic circuit is formed, with a capacity for 3-D circuit stacking. A wafer substrate 26 is provided with an array of recesses 28, either by machining or etching. The recesses 28 are sized to be slightly larger in area than corresponding discrete IC chips 30 which are placed into them. The recesses are also deeper than the chips, allowing for some compliance in the thickness of a thermoplastic glue used to retain the chips within the recesses, and thus enabling a substantially planar upper surface when the chips are positioned.

Substrate 26 can be provided either as a unitary wafer, or in two layers with chip openings in the upper layer and a solid floor in the lower layer. The substrate can be formed either from a semiconductor such as silicon, or from a ceramic. For silicon chips, the ceramic aluminum nitride provides a high degree of thermal conductivity and a good thermal expansion match with the silicon chips. However, if a thermal migration of aluminum process is used to form the substrate feedthroughs (described below), silicon must be used for the substrate.

An array of feedthroughs 32 extend through substrate 26 between its upper and lower surfaces. The feedthroughs are conductive, and may be formed either by an aluminum thermo-migration process, or by electroplating a hole formed through the substrate by either etching or laser drilling. The aluminum thermo-migration process is described in U.S. Pat. Nos. 4,239,312 and 4,275,410.

The upper ends of feedthroughs 32 are connected to selected contact pads on the IC chips 30 by means of a photolithographically formed interconnect network, functionally illustrated as connector wires 34. The feedthroughs 32 thus provide electrical paths between selected points on the IC chips 30 and the underside of the substrate 26.

FIG. 3 is a simplified view of a completed substrate 26 held in place in a support frame 36. The frame consists of upper and lower annular rings 38 and 40 having aligned openings 42 for connector bolts which hold a series of stacked frames together. The outside diameters of the two rings are equal, while the inside diameter of ring 38 is greater than that of ring 40, forming a step on the upper inner surface of ring 40. Substrate 26 is glued in place on this step. Ring 40 provides a spacer element below the substrate for a series of micro-bridge connectors 44 on the underside of the substrate. The micro-bridge connectors, described in U.S. Pat. Nos. 4,239,312 and 4,275,410, connect to selected feedthroughs 32 through a routing metallization (not shown) on the underside of the substrate. The feedthroughs in turn electrically connect to selected points on the IC circuitry recessed into the upper side of the substrate, as described above. Connections to this circuitry are also made by another set of micro-bridge connectors 46 on the upper substrate surface. Connectors 46 on the upper side of the substrate are rotated 90° with respect to connectors 44 on the underside of the substrate. This facilitates a good contact between each set of connectors and the connectors associated with adjacent substrates immediately above and below. The lower micro-bridge connectors 44 extend down more than half the thickness of lower ring 40 to establish a good contact with the connectors extending up from the substrate below.

Figure 4:
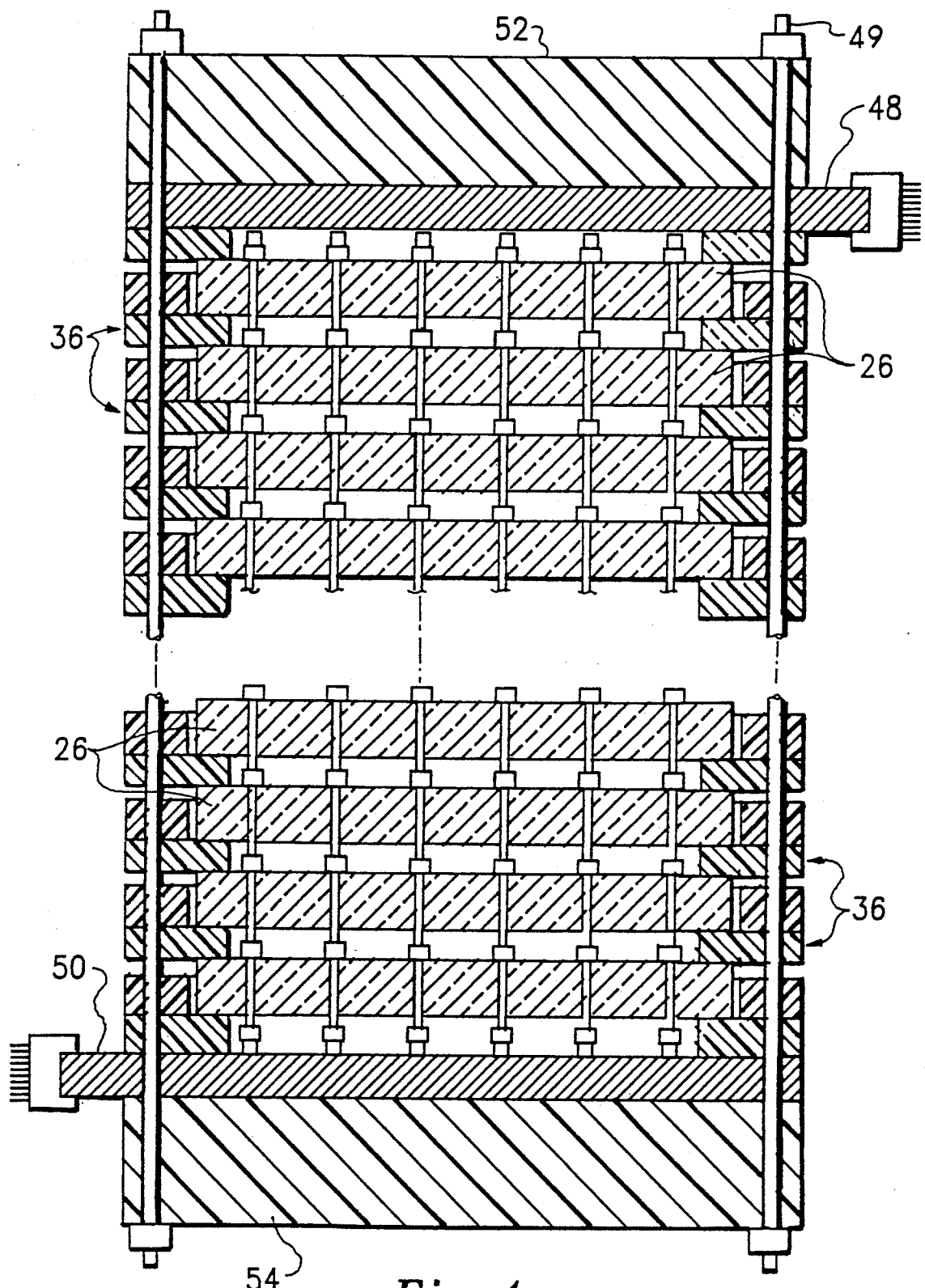
FIG. 4 is a sectional view of a 3-D stack of circuit assemblies as in FIG. 3.

FIG. 4 illustrates in simplified form a stacked 3-D assembly of substrates 26. Each substrate makes electrical contact with the substrates immediately above and below via the micro-bridge connectors, thereby making possible the formation of continuous data buses running through each of the substrates. I/O connectors 48 and 50 located immediately above and below the stack are similarly connected to the substrate stack by their own micro-bridge connectors.

The stack is held tightly together by assembly bolts 49 which extend through aligned openings in the frames 36 and in upper and lower cover plates 52 and 54. It can be seen that the outer substrate peripheries overlap the inner portions of the frames; this results in a continuous vertical mass of material which allows the substrates to be tightly packed together in a vibration resistant package.

Figure 5:
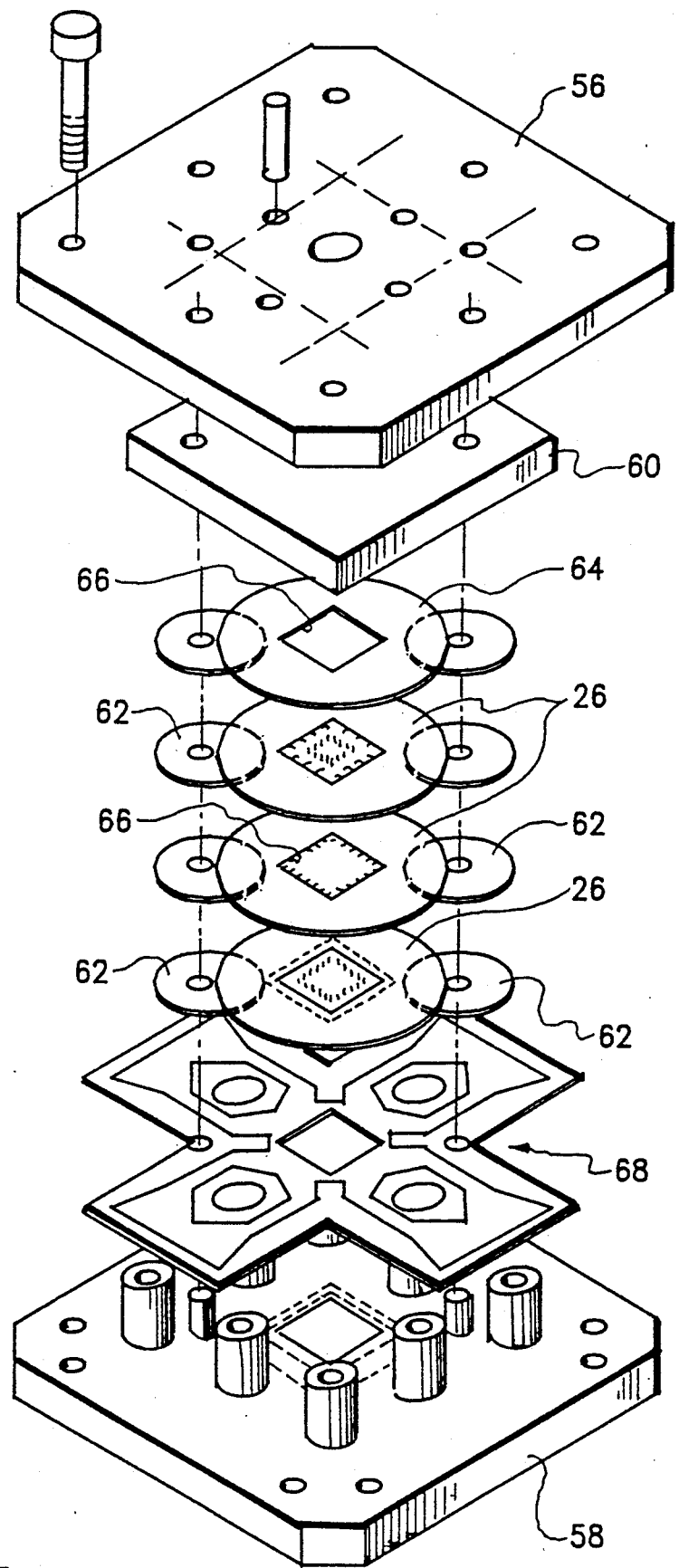
FIG. 5 is an exploded perspective view of a 3-D stack of circuit assemblies.

FIG. 5 is an exploded view of a slightly modified form of the invention. Here molybdenum top and bottom plates 56 and 58 are provided, with an aluminum plate 60 immediately below the upper molybdenum plate 56. Instead of continuous frames, the IC substrates 26 are carried by a pair of opposed steel tabs 62 in which holes are formed for the connector bolts. Successive substrates are separated by separate spacer members 64, which have central openings 66 aligned with the ICs and are similarly carried by opposed support tabs. A printed circuit board 68 at the lower end of the stack provides the I/O function.

An alternate carrier for the substrates, as well as a closer view of the IC chips 30 set in the substrate 26, is shown in FIG. 6. The IC chips 30 are secured in their corresponding recesses 28 by a thermoplastic glue. The glue is first added to the recess, then the chip is put in place, and finally the assembly is heated to set the glue, which is thermally conductive to transfer heat from the chips to the substrate. To account for different chip thicknesses and still give the assembly a substantially planar upper surface, the chips are first lightly put in place over the glue in their respective recesses, and then all the chips are pushed down with a common flat surface until their upper surfaces match the upper substrate surface. The chips will thus extend down into their respective recesses by differing amounts, depending upon their respective thicknesses.

FIG. 6 also shows the micro-bridge connector springs 44 and 46 in greater scale, with the interconnection routing discussed below in connection with FIG. 7 omitted. They are fabricated so the height of the open area under the micro-bridges is enough to compensate for distortion across the substrate, whereby complete interconnection of all the contacts can be reliably achieved. To fabricate the micro-bridges a spacer, preferably 50 microns or thicker, is first evaporated or electroplated onto the substrate. The spring contact is then evaporated on top of the spacer. Finally, the spacer is etched away, leaving a free-standing flexible micro-bridge. To secure a good contact between micro-bridges on opposed substrates, each micro-bridge is provided with an outer coating of indium tin solder which is vacuum deposited at the same time as the structural layer of the micro-bridge. Following the assembly of the 3-D stack, the substrates are heated to the melting point of the solder (about 150° C.) to fuse each mated pair of micro-bridges together, resulting in a permanent and very reliable connection.

An alternate design for the substrate frame is illustrated in FIG. 6. It consists of a block 70 of copper or other material having a high thermoconductivity, glued to the outer edge of the substrate and acting as a peripheral heat sink.

Figure 7:
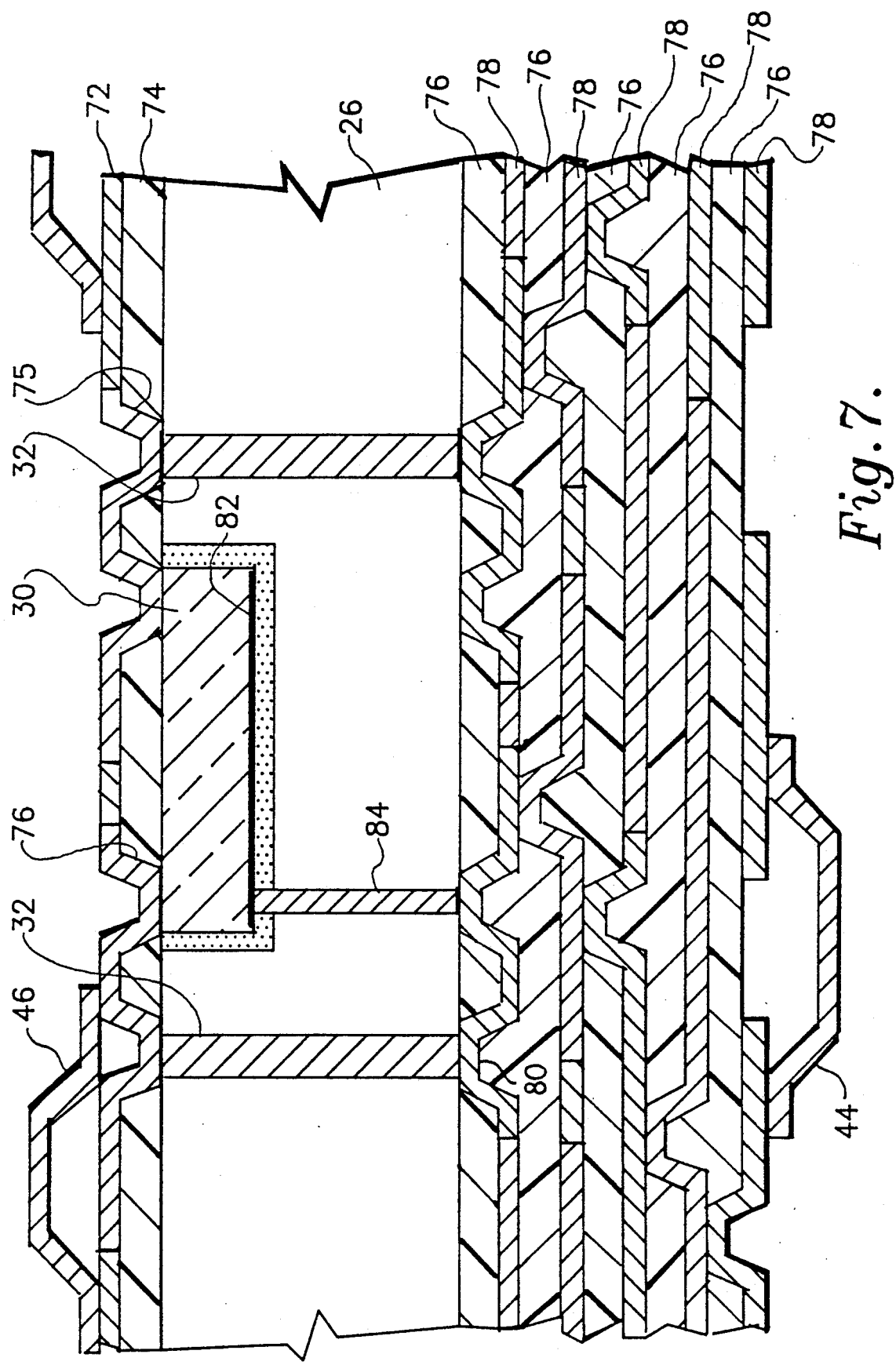
FIG. 7 is a fragmentary sectional view of a portion of a circuit assembly showing feedthroughs and electrical routing on the opposite side of the substrate from the discrete IC chips.

FIG. 7 shows a unique configuration of the interconnection routing employed in the preferred embodiment of the invention. Rather than forming the routing on the upper surface of the substrate where the IC chips are located, the routing is moved to the underside of the substrate, opposite to the chips. The only routing left on the upper chip surface electrically connects the chip to the feedthroughs 32, which feed the electrical signals to the routing on the bottom.

With this novel routing configuration, the routing can be tested before the chips are inserted into the substrate. If defects in the routing are located, they can either be repaired without danger of damaging the chips, or the substrate can be discarded without losing the chips.

Once the IC chips have been added to the substrate, the placement of the routing on the underside also makes it easier to repair defective chips. Only the single layer of routing used to connect the chips to the feedthroughs need be stripped off to access and replace or repair a defective chip. As a result, only a single replacement layer of routing needs to be fabricated after the new chip is in place.

The routing on the upper side of the substrate consists of a single network of metallization 72 which is spaced from the substrate by a dielectric layer 74. The conductive signal lines 72 are preferably formed from any suitable metal such as aluminum, copper or gold, while the dielectric 74 may be formed either from an organic material such as polyimide or an inorganic material such as $SiO_2$. The metallized pattern of conductive lines 72 are formed over the dielectric layer 74 by standard photolithographic techniques. Openings or "vias" 75 are formed through the dielectric layer 74 at desired locations to interconnect the metal lines with the feedthroughs 32 and the IC chips 30.

Since there is some tolerance in the position of the IC chips within their respective recesses, the actual chip locations are identified and stored with a microscope or T.V. camera. The stored chip positions are used to control the application of the metallized layer 72, which is performed by a standard thin-film metallization process used in microelectronics fabrication. The vias 75 can be formed either by laser drilling through the dielectric layer 74 prior to metallization, or by performing the metallization while the via locations are capped by photoresist spots, dissolving away the resist spots, using an excimer laser or oxygen reactive plasma to remove the dielectric in the newly exposed areas, and metallizing the vias thus formed.

The principal routing on the underside of the substrate consists of alternating layers of dielectric 76 and metallized interconnect lead network 78. The conductive lead lines extend into and out of the page as well as along the plane of the page as shown, and thus can interconnect a two-dimensional array of feedthroughs 32 which transmit signals from the IC chips on the other side of the substrate. The metallization network 78 closest to the substrate contacts the feedthroughs 32 through vias 80 in the dielectric layer 76 adjacent the substrate. Interconnections between successive layers of the metallization network are made through appropriate vias in the intervening dielectric layers. The routing on the underside of the substrate is formed by successive applications of a standard photolithographic technique. The micro-bridges 44 on the bottom of the underside routing are shown lengthwise for illustrative purposes, but actually would be rotated 90° so that they are orthogonal to the micro-bridges 46 on top.

Thin film capacitors 82 may be deposited in the recessed areas below the IC chips. This avoids the need for attaching bulky capacitors above or below the substrate carrier, and permits IC chip decoupling to be efficiently accomplished in a very dense package. The undersides of the capacitors 82 are connected by feedthroughs 84 and the routing network to the positive power supply, while the upper sides of the capacitors connect to their respective chips, which are generally grounded. The capacitors supply transient current and thereby reduce cross-talk between chips and power supply ground ripple.

The choice of substrate material depends upon a number of factors. In general, either silicon or aluminum nitride is used. Silicon has the advantages of being a good heat conductor, is thermally matched to silicon IC chips, and is compatible with the formation of feedthroughs by aluminum migration. Aluminum nitride, on the other hand, has a higher thermal dissipation rate, can support feedthroughs drilled with a laser, and is more insulative than silicon and therefore has a negligible parasitic capacitance to the chips and a consequently faster signal processing speed. In forming feedthroughs with an aluminum nitride substrate, the heat from the laser decomposes the substrate material, causing nitrogen to escape and leaving a conductive aluminum path in the feedthrough.

The IC assembly described herein can be used to combine different types of chips, such as CMOS, bipolar, ECL, I²L, etc., on the individual substrates. It thus offers a considerably higher degree of flexibility in circuit design than the previous 3-D wafer stack, and also offers a 3-D capability that was formerly unavailable with combinations of different type chips in a single substrate.

While several illustrative embodiments of the invention have been shown and described, numerous variations and alternate embodiments will occur to those skilled in the art without departing from the spirit and scope of the invention. For example, more than one discrete IC chip could be located in a particular substrate recess. Accordingly, it is intended that within the scope of the appended claims, the present invention may be practiced otherwise than as specifically described.

We claim:

1. An integrated circuit (IC) assembly, comprising:
    a plurality of stacked IC layers, each layer comprising;
        a substrate having a plurality of recesses extending in from one surface thereof, and
        a plurality if IC chips retained in respective recesses in said substrate,
        said substrate being formed from a material that is generally thermally matched with said IC chips,
        a plurality of conductive feedthroughs extending through the substrate between said one surface and an opposite substrate surface, and
        connector means electrically connecting said IC chips to said feedthroughs along said one surface of the substrate, said feedthroughs providing electrical paths between said chips and said opposite substrate surface; and
        means including micro-bridge connector springs on said surfaces of the substrate to enable the substrate to make electrical contact with the substrates immediately above and below.

2. The IC assembly of claim 1, wherein said IC chips are formed from silicon, and said substrate is formed from a material selected from the group consisting of silicon and aluminum nitride.

3. A 3-D integrated circuit (IC) assembly, comprising:
    a plurality of stacked IC layers, each layer comprising:
        a substrate having first and second opposed surfaces, and a plurality of recesses extending into the substrate from the first surface,
        a plurality of IC chips retained in respective recesses in the substrate,
        a plurality of conductive feedthroughs extending through the substrate between said first and second surfaces,
        connector means electrically connecting said IC chips to said feedthroughs along the first surface side of the substrate, said feedthroughs providing electrical paths between said chips and the opposite side of the substrate, and
        a network of conductive connections interconnecting said feedthroughs adjacent said second substrate surface,
    means retaining said layers in a stack with their substrates mutually aligned and spaced apart from each other, and
    interlayer connector means electrically connecting selected locations on the IC chips with selected facing locations on the conductive interconnection network of the adjacent layer.

4. The 3-D assembly of claim 3, said interlayer connector means comprising bridge springs on the IC chip sides of the substrates bearing against opposed bridge springs on the facing conductive interconnection network of the adjacent layer.

5. The 3-D IC assembly of claim 3, the network for each IC layer comprising a series of alternating conductive and non-conductive network layers.

6. The 3-D IC assembly of claim 5, wherein said conductive network layers are photolithographically patterned to establish desired interconnections between said IC chips.

7. The 3-D IC assembly of claim 3, wherein said substrates are formed from a material that is generally thermally matched with their respective IC chips.

8. The 3-D IC assembly of claim 7, wherein said IC chips are formed from silicon, said substrates are formed from a material selected from the group consisting of silicon and aluminum nitride.

9. A 3-D integrated circuit (IC) assembly, comprising:
 a plurality of stacked IC layers, each layer comprising:
  a substrate having first and second opposed surfaces,
  an IC network disposed generally along the first substrate surface,
  a plurality of electrically conductive feedthroughs extending through the substrate between said first and second surfaces,
  connector means electrically connecting selected locations in said IC network to said feedthroughs from the first surface side thereof, said feedthroughs providing electrical paths between said IC network and the opposite side of the substrate, and
  a network of conductive connectors between said feedthroughs adjacent said second substrate surface,
 means retaining said layers in a stack with their substrates mutually aligned and spaced apart from each other, and
 interlayer connector means electrically connecting selected locations on the IC chips with selected facing locations on the conductive interconnection network of the adjacent layer.

10. The 3-D assembly of claim 9, said interlayer connector means comprising bridge springs on the IC chip sides of the substrates bearing against bridge springs on the facing conductive interconnection network of the adjacent layer.

11. The 3-D IC assembly of claim 9, the network for each IC layer comprising a series of alternating conductive and non-conductive network layers.

12. The IC assembly of claim 11, wherein said conductive network layers are photolithographically patterned to establish desired interconnections between said IC chips.

* * * * *